(12) United States Patent
Landsberger et al.

(10) Patent No.: US 7,956,717 B2
(45) Date of Patent: Jun. 7, 2011

(54) POWER-MEASURED PULSES FOR THERMAL TRIMMING

(75) Inventors: Leslie M. Landsberger, Westmount (CA); Oleg Grudin, Montreal (CA); Gennadiy Frolov, Montreal (CA)

(73) Assignee: Microbridge Technologies Inc., Montreal (CA)

( * ) Notice: Subject to any disclaimer, the term of this patent is extended or adjusted under 35 U.S.C. 154(b) by 1023 days.

(21) Appl. No.: 11/793,385

(22) PCT Filed: Jan. 30, 2007

(86) PCT No.: PCT/CA2007/000139

§ 371 (c)(1),
(2), (4) Date: Jun. 18, 2007

(87) PCT Pub. No.: WO2007/085095

PCT Pub. Date: Aug. 2, 2007

(65) Prior Publication Data

US 2009/0142858 A1    Jun. 4, 2009

Related U.S. Application Data

(60) Provisional application No. 60/762,884, filed on Jan. 30, 2006.

(51) Int. Cl.
*H01C 10/00* (2006.01)
(52) U.S. Cl. .......... 338/195; 338/48; 338/320; 29/610.1
(58) Field of Classification Search .................. 338/195, 338/48, 314, 320; 29/610.1; 437/228, 248, 437/918; 73/204
See application file for complete search history.

(56) References Cited

U.S. PATENT DOCUMENTS

| 4,472,239 | A |   | 9/1984 | Johnson et al. |
|-----------|---|---|--------|----------------|
| 4,624,137 | A | * | 11/1986 | Johnson et al. ............. 73/204.26 |
| 4,696,188 | A | * | 9/1987 | Higashi ....................... 73/204.19 |
| 5,466,484 | A |   | 11/1995 | Spraggins et al. |
| 5,635,893 | A |   | 6/1997 | Spraggins et al. |
| 2004/0097859 | A1 |   | 5/2004 | Stearns |

FOREIGN PATENT DOCUMENTS

WO    WO03023794    3/2003

OTHER PUBLICATIONS

International Search Report dated Apr. 23, 2007 from the International Application PCT/CA2007/000139.
Feldbaumer et al., "Pulse Current Trimming of Polysilicon Resistors", Transactions on electron devices, IEEE, vol. 42, No. 4, Apr. 1995.

* cited by examiner

*Primary Examiner* — Kyung Lee
(74) *Attorney, Agent, or Firm* — Ogilvy Renault LLP

(57) ABSTRACT

A circuit for trimming a thermally-trimmable resistor, measuring a temperature coefficient of resistance of the thermally-trimmable resistor, and annealing a thermally-trimmable resistor post-trimming, the circuit comprising: a thermally-isolated area on a substrate housing the thermally-trimmable resistor; heating circuitry for applying a signal to a heating resistor; and a constant-power module adapted to maintain power dissipated in the heating resistor substantially constant over a duration of the signal by varying at least one parameter of the signal as a result of a change in resistance of the heating resistor during the signal.

34 Claims, 5 Drawing Sheets

Output Voltage vs Time

Dissipated Power vs Time
Wh=k2 Vh, k2=const

POWER-MEASURED PULSES FOR THERMAL TRIMMING

CROSS-REFERENCE TO RELATED APPLICATIONS

The present application claims priority of U.S. Provisional Patent Application No. 60/762,884, filed on Jan. 30, 2006.

TECHNICAL FIELD

The invention relates to resistors and resistor networks which are electro-thermally trimmable, and more specifically, to thermal trimming of these resistors to adjust parameters such as resistance, temperature coefficient of resistance and relative temperature coefficient of resistance.

BACKGROUND OF THE INVENTION

Prior art on thermal trimming of resistors has disclosed and addressed several configurations and variations. Thermal trimming of a thermally-mutable resistor is possible whether or not it is residing on or in a thermally-isolated microstructure. Also, there may or may not be a separate auxiliary heater used to apply heating power to a functional resistor which is intended to be trimmed. A sequence of electric voltage or current pulses is applied to a resistor (whether separate or not), in order to thermally trim the functional resistor.

For example, in Feldbaumer D W et al: "Pulse current trimming of polysilicon resistors", simple functional resistors made from deposited polysilicon embedded within surface films in an integrated circuit chip can be thermally-trimmed by simply passing a high-enough current (or current density) through that resistor to sufficiently raise its temperature. Others propose a melting-segregation model to explain the self-trimming phenomena. U.S. Pat. No. 5,466,484 teaches the use of an auxiliary heating resistor to heat a functional resistor, where a heating voltage or current is applied to that separate heating resistor in order to raise the temperature of the functional resistor. WO 03/023794 discloses thermally-trimmable devices using thermally-isolated microstructures, such as micro-platforms suspended over cavities in silicon, in order to achieve higher temperatures at lower voltages and currents.

In general, thermal trimming has been disclosed, done by "self-trimming" where the electric trimming signals are applied directly to the functional resistor, or done by applying the trimming signals to a separate auxiliary heater-resistor. In both cases, there is potentially a fundamental problem with the stability of the resistor to which the trimming signals are applied. Hereafter in this text, this resistor will be referred to as the "heater-resistor", regardless of whether it is the same physical resistor as the functional resistor targeted for thermal trimming. If this heater-resistor is itself thermally-mutable, then the temperature of the target functional resistor (which may be the same resistor as the heater-resistor) may change during the trimming signals, from one pulse to the next for a constant-level input signal, or even during the course of a single trimming pulse at a constant voltage or current. Such variations in electric resistance in the heater-resistor can lead to unpredictable changes in dissipated power, and loss of control over the trimming process. An example of this situation is depicted in FIG. 1.

Indeed, the heater-resistor typically is thermally-mutable. In the case of a separate auxiliary heater-resistor, it is often desirable to make the heater-resistor out of materials typically available in a standard semiconductor integrated circuit process—it is often not convenient to design or incorporate into the fabrication process a special material for the separate heater-resistor. For example, since the heater-resistor material must be compatible with trimming temperatures, in many processes the only practical material is a deposited polycrystalline silicon (or SiGe) resistor. Metals (e.g. Al, Cu) may melt at thermal trimming temperatures such as (700-800° C.), and resistors diffused into the bulk silicon cannot be effectively thermally isolated from the substrate well enough in order to trim resistors typically found sandwiched between surface dielectric layers. In the present state of the art, if the heater is manufactured from a non-thermally-trimmable material, or from a material which is relatively stable at the temperatures needed to thermally trim the functional resistor, then this may introduce extra complexity (expense, difficulty, and/or infeasibility), in the manufacturing process.

SUMMARY OF THE INVENTION

Thus, it is proposed to use electric power applied to the heater, as a measure of trimming pulses instead of voltage or current applied to the heater, to keep control over the heater temperature.

In thermal trimming of thermally-isolated resistors, such as those housed in thermally-isolated microstructures, the heater-resistor can become unstable during the trimming signal. This instability leads to at least two problems specific to the context of thermal trimming, namely thermal runaway during a given pulse, and an inability to ensure that the temperature induced by a subsequent pulse will have a specific relationship to the previous pulse, such as being higher or lower by a specific amount. The instability of the resistor is unpredictable. Thus, it is advantageous that the trimming signals be "power-measured", which allows the power (and therefore the temperature) to be known throughout (before, during, and after) a sequence of electrical signals applied to the heater. It is also advantageous in some cases that the trimming signals be "power-controlled", such that they maintain a substantially constant power dissipation during the signal applied to the heater, even if the heater-resistance is unstable and changing its material properties.

In accordance with a first broad aspect of the present invention, there is provided a method for trimming a thermally-trimmable resistor thermally-isolated on a substrate, the method comprising: applying a signal to a heating resistor to trim the thermally-trimmable resistor; and maintaining power dissipated in the heating resistor substantially constant over a duration of the signal by varying at least one parameter of the signal as a result of a change in resistance of the heating resistor during the signal.

In accordance with a second broad aspect of the present invention, there is provided a method for determining a change in temperature coefficient of resistance, due to thermal trimming, of a thermally-trimmable resistor thermally-isolated on a substrate, the method comprising: measuring at least a first resistance value of the thermally-trimmable resistor at a first temperature; applying a first power-measured heating signal to a heating resistor to elevate a temperature of the thermally-trimmable resistor to a second temperature higher than the first temperature; measuring at least a second resistance value of the thermally-trimmable resistor at the second temperature; trimming the thermally-trimmable resistor by applying at least one trimming signal to the heating resistor; measuring at least a third resistance value of the thermally-trimmable resistor at a third temperature; applying a second power-measured heating signal to the heating resistor post-trimming to elevate a temperature of the thermally-trimmable resistor to a fourth temperature higher than the third temperature; measuring at least a fourth resistance value of the thermally-trimmable resistor at the fourth temperature; and determining the change in temperature coefficient of resistance based on the measured first, second, third, and fourth resistance values using known power values of the first power-measured signal and the second power measured signal.

It should be understood that the measurements of the first and second resistance values can be done in any order. For example, one way includes taking a measurement of the first resistance value at room temperature, heating the resistor to a second temperature, and taking the measurement of the second resistance value. Another scenario is heating the resistor to the second temperature, taking the measurement of the second resistance value, and allowing the resistor to cool to the first temperature to measure the resistor for the first resistance value. Also alternatively, the resistor can be heated to two separate temperatures and the measurements are taken at each heated temperature. This also applies to the measurements of the third and fourth resistance values, which can be done in the same ways.

In accordance with a third broad aspect of the present invention, there is provided a method for annealing a thermally-trimmable resistor thermally-isolated on a substrate, the method comprising: trimming the thermally-trimmable resistor by applying a first power-measured signal to a heating resistor; and applying a second power-measured signal corresponding to an average annealing temperature to the heating resistor, wherein the second power-measured signal has a lower power level than the first power-measured signal.

In accordance with a fourth broad aspect of the present invention, there is provided a circuit for trimming a thermally-trimmable resistor, measuring a temperature coefficient of resistance of the thermally-trimmable resistor, and annealing a thermally-trimmable resistor post-trimming, the circuit comprising: a thermally-isolated area on a substrate housing the thermally-trimmable resistor; heating circuitry for applying a signal to a heating resistor; and a constant-power module adapted to maintain power dissipated in the heating resistor substantially constant over a duration of the signal by varying at least one parameter of the signal as a result of a change in resistance of the heating resistor during the signal.

In this specification, the term "heating resistor" is intended to mean the resistor to which a heat pulse is applied for trimming purposes, regardless of whether it is the same physical resistor as the functional resistor targeted for thermal trimming. The term "signal" is intended to mean a single pulse, a sequence of pulses, or an input code that gets transformed into an electrical signal applied to a component. The term "power" is intended to mean either instantaneous power or time-averaged power. The term "power-measured" should be understood as meaning a signal having a known power level, power being the parameter by which the pulse is measured. The term "power-controlled" should be understood as meaning a signal where the power level of the pulse is controlled by varying/setting other parameters which affect the power, such as voltage or current.

BRIEF DESCRIPTION OF THE DRAWINGS

Further features and advantages of the present invention will become apparent from the following detailed description, taken in combination with the appended drawings, in which:

FIG. 2 bottom is a bar graph showing a trimming range of resistors using a sequence of constant-power pulses at varying levels of the reference power;

It will be noted that throughout the appended drawings, like features are identified by like reference numerals.

DETAILED DESCRIPTION OF THE PREFERRED EMBODIMENT

Figure 1:
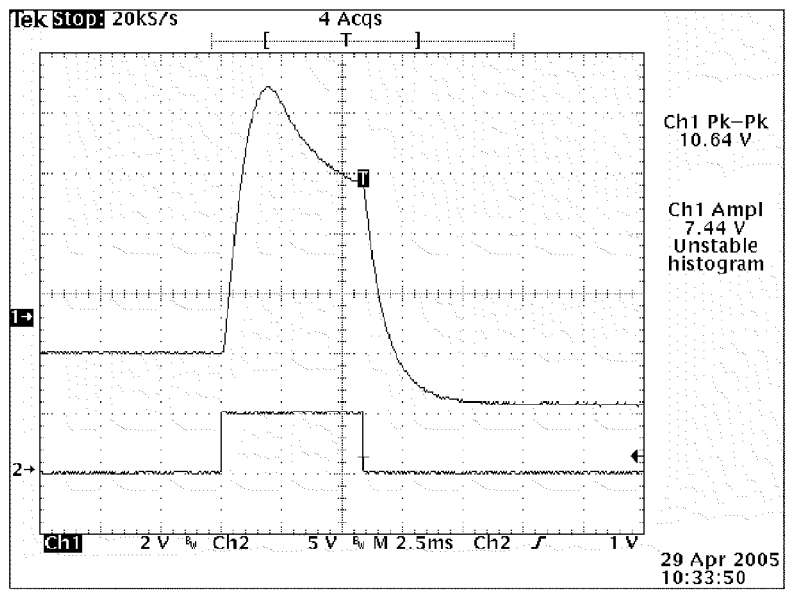
FIG. 1 is an oscilloscope snapshot of the resistance of a heater-resistor, for a constant-voltage pulse applied. Thus, one can see the change in a heater's resistance during and due to a high temperature pulse of duration 6 ms.

This invention proposes a method to mitigate the above-described problem of heater-resistor stability. Thermal trimming is fundamentally controlled by temperature, and typically there is no reliable temperature sensor in the trimming zone (because typically the heater-resistor and functional-resistor may be both unstable at trimming temperatures, and because design of another explicit temperature sensor would raise further inconvenience). Therefore, the resistors, microstructure, and system to apply heating pulses, are co-designed, taking account of the temperature-coefficients (magnitude and sign) of resistance of the heater, heating-pulse-voltage, pulse-current and pulse-power, speed of resistance changes in the heater-resistor during thermal trimming, relative temperature ranges of thermal trimmability of the heater-resistor and functional resistor, as well as thermal inertia and thermal isolation of the microstructure(s).

Pulses of constant electric power are used for thermal trimming. It is proposed to use electric power applied to the heater-resistor, as a measure of intended trimming-pulse amplitude (for controlling trimming temperature).

In general, the temperature (T) of the microstructure is G*P, where G is the "thermal isolation" of microstructure in K/mW. The quantity "thermal isolation" of a microstructure describes how high a temperature can be reached in the microstructure, for a given amount of power dissipated in the microstructure. Thermal isolation is determined predominantly by the overall geometry and heat-loss mechanisms, and heat-conductive properties of the microstructure materials. P is the power ($V*I=V^2/R$) dissipated in the microstructure as a result of the electric signal (e.g. a pulse of voltage, current or power). In a thermal trimming context, the functional resistor and separate heater, if present, are typically in close thermal contact (at substantially the same temperature, or close in temperature). In a thermal trimming context, the thermal isolation, G, (of the device in a microstructure or on a substrate), is typically far more stable than the trimmable resistance itself. Even if the thermal conductivities are changing in the materials in the hottest zone of the structure, the thermal conductivities of the materials outside the hottest zone should change much less, if at all, and it is these locations which primarily determine the thermal isolation between the structure and its surroundings. For example, in a thermally-isolated microstructure consisting of a two-armed cantilever, even if the thermal conductivities of the materials in the main cantilever may change (reversibly or irreversibly) due to high temperatures, still the thermal isolation will be primarily determined by the thermal conductivities of the materials in the arms of the cantilevers, where they join the main silicon bulk—and these materials do not see the same high temperatures. In this case, the time-varying temperature in the microstructure can be described as $T(t)=V(t)*I(t)*G$. Instability in the heater-resistor is represented by instability in either $V(t)$ or $I(t)$ or both. Maintaining the stability of one of $I(t)$ or $V(t)$ is not enough, if the other remains unstable. However, if the applied power, $V(t)*I(t)$, could be well-enough controlled, then $T(t)=P(t)*G$, and then the time-variation of the temperature would follow the time-variation of the applied power. Thus, if a constant power is dissipated in the heater-resistor, this should maintain a substantially constant temperature within the target functional resistor, even if the resistance of the heater-resistor is changing.

In order to accomplish this constant power dissipation in the heater-resistor, the voltage and current applied to the heater-resistor must be designed and/or modulated to maintain the desired constant power. The temperature attained in the heater-resistor should be controlled especially in cases where the heater temperatures needed for trimming the functional resistor are quite close beneath the temperatures at which the heater-resistor would be damaged (open-circuited).

This is true whether or not the thermally-trimmable resistor resides on a microstructure with high thermal isolation. In any case, the method of delivery of the power-controlled trimming must be designed with the relevant specific particular properties of thermal-isolation, thermal-inertia, and thermal-trimmability in mind.

If the heater-resistor is an auxiliary resistor separate from the functional resistor, then the two resistors may be made of the same material or different material. The thermal-mutability properties (temperature range of thermal mutability, and speed of change of resistance due to thermal pulses within that temperature range), of the two resistor materials may be the same or different.

Heater-resistor instability and/or thermal runaway can lead to loss of control over the trimming process, with degraded trimming performance, in various ways.

For example, consider a sequence of pulses whose voltage is being increased in order to begin trimming. The initial pulses at low voltages may not trim because they do not raise the temperature of the microstructure high enough. As the pulse voltage is increased, and thus the applied heating power is increased, eventually the heater-resistor's resistance may begin to change. In accord with typical thermal trimming phenomena, as the temperature is increased, eventually the heater-resistor will be trimmed in a decreasing direction (trimmed down), and for higher temperatures the trim-down will be accelerated. At such a threshold (which may be typically difficult to measure or know a priori), if the pulse voltage is increased by an increment delta-V ($\Delta V$), this can quickly (in a single pulse) trim the heater-resistance down substantially. In this case, the current (and therefore power, given a constant or increasing voltage) can increase dramatically, thus further rapidly trimming down the heater-resistance, thus further increasing current and power, and thus the temperature may quickly increase enough to melt or otherwise catastrophically damage the heater and/or microstructure.

Consider the case where the heater-resistor has a positive temperature coefficient of resistance (TCR), and receives a constant-current pulse (abbreviated below as "I+TC"). Voltage $V=I*R$ would be applied. As a consequence, power $V*I$ is dissipated, raising the temperature of the heater-resistor. Due to the positive TCR, the higher temperature increases the resistance. If the current is held constant, the voltage must increase, which would increase the dissipated power, which would in turn further increase the temperature, leading potentially to a thermal runaway condition.

Further, the resistance vs. temperature behavior of the heater-resistor may be non-linear, with a positive or negative curvature. If, in the above "I+TC" case, the resistance vs. temperature relationship had a significant positive curvature, then this would act to further aggravate the thermal runaway. Typical thermally-trimmable materials such as polysilicon tend to have positive (slight or more-significant) curvature in the behavior of resistance vs. temperature, at least until the temperature approaches trimming temperatures of the material.

If the system reaches a temperature at which the resistor is unstable, further changes may occur. For example, for typical thermally-trimmable polycrystalline materials such as polysilicon, if the resistance is trimmed downward, the TCR may simultaneously increase. If such a trim-down temperature is reached, then the instability in resistance and/or TCR may or may not act to further increase the voltage needed to hold a constant current, and therefore may or may not act to further increase the temperature, and may or may not lead to faster thermal runaway.

For example, in the particular example of "I+TC" described above, if, as the temperature reaches the trimming temperature of the heater-resistor, the behavior of resistance vs. temperature were to curve downwards, this would tend to limit thermal runaway, at least in this high-temperature regime.

If instead constant-voltage pulses are used with a positive-TCR heater-resistor (abbreviated "V+TC"), the system initially tends to limit thermal runaway, since increased resistance tends to reduce the current and thus reduce applied power. However, as trimming temperatures are reached, if the resistance vs. temperature tended to have a downward curvature, this would tend to promote thermal runaway.

Consider also the case where the heater-resistor has a negative TCR, and receives a constant-voltage pulse ("V−TC"). Current $I=V/R$ would flow. As a consequence, power $V*I$ is dissipated, raising the temperature of the heater-resistor. Due to the negative TCR, the higher temperature decreases the resistance. If the voltage is held constant, the current would then increase, which would increase the dissipated power, which would in turn further increase the temperature, potentially leading to thermal runaway.

In this "V−TC" case, however, if the behavior of resistance vs. temperature of the heater-resistor curves upwards, this will tend to counteract thermal runaway.

If constant-current pulses are used with a negative TCR heater-resistor ("I−TC"), the system initially tends to limit thermal runaway, since decreased resistance tends to reduce the voltage and thus reduce the applied power. However, as trimming temperatures are reached, if the resistance vs. temperature has upward curvature, this would tend to promote thermal runaway.

The relative temperature ranges of thermal mutability of the heater-resistor and target functional resistor should be considered. If the temperature range of thermal mutability of the heater-resistor is not at a significantly higher temperature than that of the target functional resistor, then the heater-resistor may be prone to instability or thermal runaway during trimming. Similarly, at a given trimming temperature in the temperature range of trimmability of the target functional resistor, if the speed of resistance change of the heater-resistor is not much slower than that of the target functional resistor, then the heater resistor may be prone to instability or thermal runaway during its use in trimming the functional resistor. In general, thermal runaway of the heater should be avoided at any temperature intended for use of the heater. If the heater-resistor is prone to thermal runaway at any intended usage temperature, it may be important to use power-control instead of voltage-control or current-control.

Power (P) dissipated on the heater-resistor is $P=V^2/R$. If the heater resistance decreases significantly due to self-trimming during the heating pulse (or after the previous heating pulse), then, for a constant applied voltage, the dissipated power in that heater further increases, causing further increase of temperature. This thermal runaway phenomenon can cause the heater to be damaged due to excessively high temperature (become an open circuit). For example, if a heater resistance begins at ~1.5K Ω (fresh untrimmed resistor) and varies to ~700-800Ω (after trimming), then the adaptive trimming algorithm which regulates the next pulse voltage amplitude depending on decrement/increment of the trimmable resistor (WO2004/097859) may be able to adapt the heating voltage if the heater resistance decreases slowly. Unfortunately, it cannot protect the heater from thermal runaway if its resistance decreases rapidly during a single pulse. Note that the probability of the heater being damaged increases with the extent of trim-down (difference between $R_{start}$ and $R_{target}$), which requires higher temperature.

In general, the tendency toward thermal runaway is determined by the overall direction and magnitude of resistance instability at high temperature. This is a combination of positive/negative temperature coefficient, non-linearity of temperature coefficients, and non-tempco-based (thermal-trimming-based) resistance changes at high temperatures. The behaviour of this combination at high temperatures may be difficult to predict. Therefore empirical measurement of resistance may be useful in order to select favorable characteristics for the electrical pulses applied to the heater-resistor. The electrical pulses may be characterized in that the parameter by which they are measured is voltage, or current, or power.

As another example of degradation of trimming performance, if one wants to prevent the above-described thermal-runaway condition, one may attempt to limit the applied voltage or limit any increase in applied voltage, such that heater-trim-down is limited during a single pulse, and monitor the resistance of the heater in some way (for example, one may use the trimming of the functional resistor as an indicator of changes in the heater). However, in this case the time required for trimming may increase substantially, since many pulses may be applied while searching for an appropriate trim-down.

FIG. 1 is an oscilloscope snapshot which depicts the "fresh" heater's material resistance change due to high temperature pulse. The lower pulse (channel 2) is the trigger signal sent to the oscilloscope. This demonstrates how the heater resistance is decreasing (self-trimming) substantially during a heating voltage pulse of approximately 6 ms.

Figure 2:
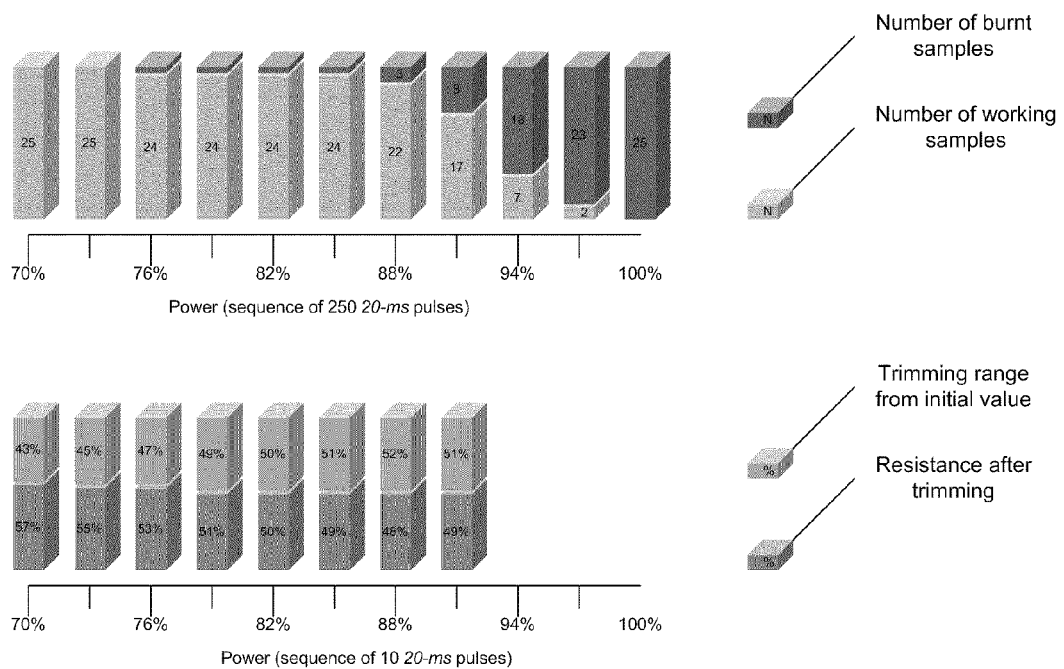
FIG. 2 top is a bar graph illustrating experimental results of trimming of resistors by constant-power pulses of increasing amplitude.

The upper part of FIG. 2 shows experimentally measured results of constant-power trimming of 25 resistors at constant-power pulses of increasing amplitude (sequences of 250 20 ms pulses at that constant power). Each of the 25 resistors was exposed to the same constant power beginning at a relatively low amplitude. The power amplitude was increased until catastrophic damage events (open-circuited heaters) were recorded. The progression of damage events is recorded in the upper part of the figure. The power amplitude was increased until eventually all of the heaters were open-circuited, and this level is represented as 100% in the horizontal axes of the graphs above. This result shows that at a pulse power of 73% of the maximum, there are no damage events.

Next, a fresh set of 5 samples was further tested using a sequence of 10 20 ms constant-power pulses at 70% of the reference power. This result shows that, at a pulse power level which does not cause damage events, one can readily trim down by 43% of the as-manufactured resistance value.

The method of the present invention also provides accurate temperature control during post-trim annealing. Annealing of the trimmed resistor (at T lower than applied during trimming down) improves its stability. In practice, this post-trim annealing can be applied by the same heater-resistor as used for trimming. However, as was mentioned above, resistance of the heater-resistor after trimming may vary substantially, (for example, from ~1.5KΩ to ~700Ω). Note that such large variations in heater-resistance may be present, even if there is no severe thermal runaway condition as described above (even if the trimming was successful). Since one typically does not have a ready measurement of this heater-resistor after trimming, generation of a predetermined annealing temperature is not practical by using constant voltage or current pulses—constant or known electric power is required to be applied to the heater. For example, if one trims three thermally-trimmable resistors, the first by only a few percent down, the second by 15%-down, and the third by 35%-down, after the end of the trimming processes, the heater-resistors are likely to have widely different resistances, such as ~1400Ω, ~1000Ω, and 700Ω, respectively. This is because the three sequences of trimming pulses will have been quite different. Then, if one wants to apply a predetermined annealing temperature for a certain amount of time, the situation is different from that during thermal trimming with feedback. In an adaptive sequence of trimming pulses, one typically has feedback by measuring the resistor, or a related circuit output, between pulses. However, here the goal is to apply a single annealing temperature, with little-to-no opportunity for feedback. But with such widely varying heater-resistances, the true applied power (and thus the temperature in the target functional resistor), can vary by a factor of two or more—causing widely different post-anneal results. With the technique of the present invention, one can apply a single power-measured electrical pulse, or a sequence of power-measured electrical stimuli, each corresponding to an annealing temperature in the heater-resistor (or in the functional resistor, if different), where one doesn't necessarily let the structure cool after each pulse or stimulus. Of course, depending on the temperature uniformity in the heater-resistor, functional-resistor, or micro-platform, the annealing temperature may represent an "average" or "effective" temperature. The electrical pulses or stimuli may each correspond to different temperatures.

Instantaneous TCR measurements are also possible using the method of the present invention. It is known that polysilicon may in many cases change its TCR during thermal trimming. The thermal isolation (G, in K/mW) of microstructures can be found experimentally, and is not expected to change significantly with trim. Assuming that trimming doesn't change this characteristic thermal isolation appreciably, one can use constant-power pulses to measure the TCR. The temperature of microstructure can be increased by a certain value $\Delta T$ (still far below trimming temperatures), by applying predetermined power $P=\Delta T/G$ which causes resistance change $\Delta R$. In this case TCR (in ppm/K) of the polysilicon resistor can be calculated as:

$$TCR = \Delta R/(R\Delta T) = (R(T0+\Delta T) - R(T0))/(R\Delta T),$$

where T0 is operating temperature of poly-silicon resistor.

Figure 3A:
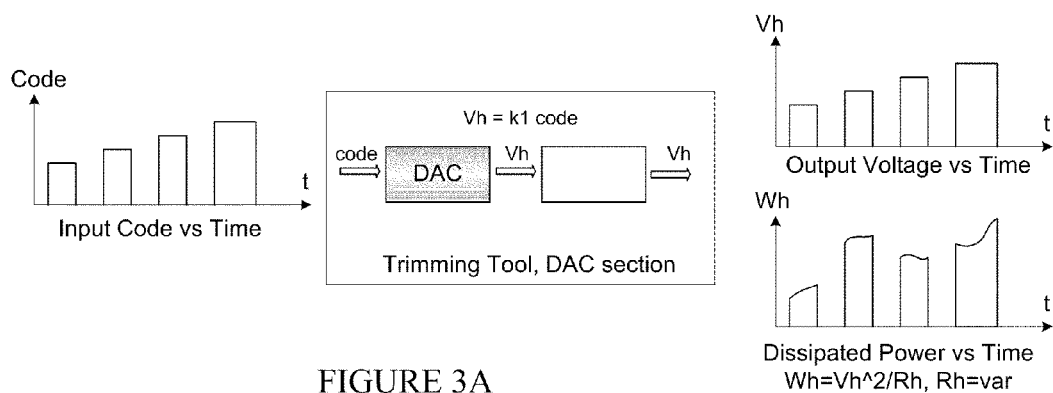
FIG. 3a illustrates a first example of output power subject to changes, even during each single pulse, when input voltage is held constant during each individual pulse, for typical trimming events.

Reliable control of heater temperature can be achieved by applying a well-determined amount of power instead of voltage. FIG. 3a shows an example where the trimming hardware ("Trimming Tool") applies voltage pulses to the heater. The desired input signals are represented as a numerical "code" (digital input). These input signals are translated into analog electrical signals by a Digital-to-Analog converter (DAC), creating a sequence of voltage pulses applied to the heater, Vh vs. t. As described above, if the resistance of the heater changes due to thermal instability, the dissipated power may vary widely during the pulse train, even during an individual pulse, as shown in the lower plot, Ph vs. t.

Figure 3B:
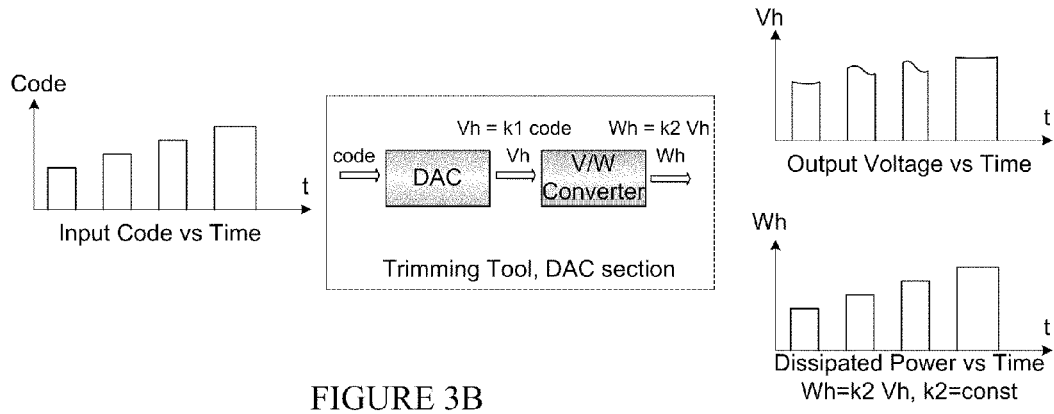
FIG. 3b illustrates a second example where output power changes with (and is controlled by), input voltage, but the output power is maintained constant during each individual pulse.

FIG. 3b, on the other hand, shows a voltage-to-power (V-to-P) converter in the signal path, to resolve this problem. The V-to-P converter transforms input voltage into output power (e.g. delivering an output power proportional to input voltage, for example 1V=100 mW), independently from the instantaneous value of the output load (heater) resistance.

The V-to-P converter adjusts the instantaneous output voltage, to compensate for changes in heater resistance during a single pulse, such that the output power remains determined by the input voltage. This is shown by the correspondence in FIG. 3b between Ph vs. t and the input code.

In general, the input code represents the desired level of power that one wants to be dissipated in the heater-resistor. This input code can reside in many forms, such as in the preferences of a person executing a manual trimming sequence, or in the decisions made by an automated trimming algorithm, or in a pre-determined sequence of pulses recorded in any memory medium. In practice, the input code is often "decided" by a computer program, and sent to trimming circuitry as digital signals. In such a case, the digital signals can be converted from digital to analog signals, typically as voltages or currents, where the analog amplitude of the voltage or current represents the desired power to be dissipated in the heater-resistor. It is also possible that, in the signal path, the code is converted to a frequency of an oscillating signal, or a pulse-width of pulses within a high-frequency pulse-train, or any other parameter of an electrical signal. No matter how the "code" is stored, transmitted or delivered, before it is applied to the heater-resistor it is converted into an amount of dissipated power which remains substantially constant even while the heater-resistance may be changing, even during a single pulse applied to it.

Therefore, many specific conversion schemes may be useful at one point or another in the signal path from "code" to heater-resistor. Without limiting the scope of the invention, several specific cases are outlined below. For example, active voltage-to-power (V-to-P) conversion is described, with the understanding that if the "code" is delivered as a current, active current-to-power (I-to-P) conversion is also available using typical electrical engineering analysis techniques.

Figure 4:
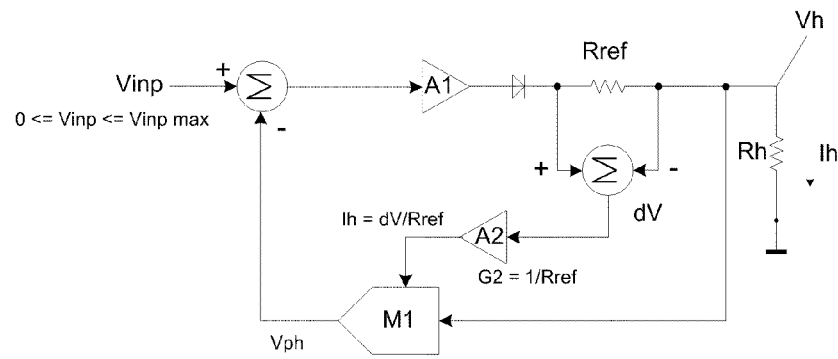
FIG. 4 is a circuit diagram of a feedback loop used as a voltage-to-power converter.

FIG. 4 shows the simplified block diagram for a feedback loop for a V-to-P converter. For simplicity, the feedback loop frequency response is not discussed here. Basically, the feedback loop time delay was set as a function of the thermal inertia of the heater. The following equations describe the circuit operation:

$$dV = Ih \times Rref \quad (1)$$

$$Ph = Vh \times Ih \quad (2)$$

$$Vinp = Vph, \text{ when Gain} \gg 1 \quad (3)$$

where:
dV—voltage drop across Rref (V)
Ih—heater current (A)
Rref—reference resistor (Ohm)
Rh—heater (Ohm)
Ph—heater dissipated power (W)
Vh—heater voltage (V)
Vinp—input voltage (V)
Vph—voltage equivalent of power dissipated in the heater (V)
Gain—gain of the feedback loop.

The converter consists of three major components—the fixed reference resistor $R_{ref}$ to create a voltage drop proportional to the current passing through an auxiliary heater; the amplifier A2 to amplify the above-mentioned voltage; and the analog multiplier M1 to produce the voltage, Vph, equivalent to dissipated power Ph. This type of active converter maintains the power Ph=Ih*Vh applied to the heater-resistor, proportional to the voltage input from the digital code.

A passive implementation for V-to-P conversion is shown in FIG. 5. It comprises only one component—a fixed-value ballast resistor Rb. In this case the heater's current Ih and voltage Vh can be found as:

$$Ih = Vinp/(Rb+Rh) \Rightarrow \text{decrease of } Rh \text{ increases } Ih \quad (5)$$

$$Vh = Vinp/(1+Rb/Rh) \Rightarrow \text{decrease of } Rh \text{ decreases } Vh \quad (6).$$

From equations (5) and (6), it follows that Ih and Vh compensate each other to a significant extent, improving the consistency of the heater's dissipated power Ph, as Rh varies. For example:
1. Rb=1 k;
Initial heater resistance Rh0=1 k; Vinp=2V, then
Ih0=1 mA, Vh0=1V, Ph0=1 mW.
If heater resistance Rh due to trimming becomes 0.9 k, then
Ih=1.052 mA, Vh=0.947V, Ph=0.996 mW.
dP=(Ph−Ph0)/Ph0×100%=0.4%
2. Rb=0;
Initial heater resistance Rh0=1 k; Vinp=1V, then
Ih0=1 mA, Vh0=1V, Ph=1 mW.
The same 10% heater resistance change will result:
Ih=1.111 mA, Vh=1V, Ph=1.111 mW
dP=(Ph−Ph0)/Ph0×100%=11.1%

Fundamentally, this passive conversion technique relies on the relationship between the resistance values Rh and Rb. Rh must remain relatively close to Rb when the heater-resistor is at temperatures required for trimming the functional resistor (which may or may not be the same resistor as the heater-resistor). During trimming, the heater-resistor may vary substantially (e.g. by a percentage as great as 50%). The value of Rb should be chosen to keep Rb roughly in the center of the range of resistances which the heater-resistor may assume during trimming of the functional resistor (the range of resistances which the heater-resistor may assume at heater-resistor temperatures such that the functional resistor is trimmed). If this conversion scheme is to be used for local annealing of the functional resistor at temperatures relatively lower than typical thermal trimming temperatures (such that little-to-no resistance change occurs), then the range of resistances should include as well the resistance values of Rh in the temperature-range needed for annealing of the functional resistor. In order for the ballast resistor Rb to remain fixed during the heater-resistor's temperature excursions, Rb should be located outside of the physical space which is heated by the heater-resistor, OR should have very low TCR and have stable Rb in a temperature range which includes the temperature at which the heater becomes thermally unstable. Similar to the above passive V-to-P conversion, passive I-to-P conversion can be readily implemented by connecting a fixed-value Rb in parallel with the heater-resistor, Rh.

Figure 5A:
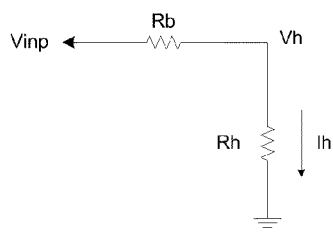
FIG. 5a is a circuit diagram of a generic passive voltage-to-power converter, using a ballast resistor in series with the heater-resistor.

In many instances some compromises must be made regarding V-to-P converter design. In the case of FIG. 5a, the tradeoff is between simplicity and direct matching of response-time (passive case), vs. accuracy of V-to-P conversion (active case). Note also that in FIG. 5a, the trimming voltages input to the V-to-P converter must be approximately double the voltage applied to the heater-resistor. If simplicity and bipolarity are of primary importance, the R ballast design may be chosen, at the cost of decreased precision and the need for approximately two times increased value of input voltage Vinp. The speed of response of such a passive power-control scheme will be limited by the parasitic capacitance and inductance of the resistors Rb and Rh, and associated interconnection conductors, or by the output impedance of the voltage- or current-source. These must be designed to be fast enough—faster than the greatest speed of resistance change (ohms per time or resistance-fraction per time) in the heater resistor during thermal trimming operations.

In designing passive V-to-P conversion as described above, the ratio of ballast resistance, Rb, to the initial (untrimmed) heater resistance, $Rh_0$, is considered. This ratio is selected bearing in mind that (a) Rh at trimming temperatures will be different from Rh at room temperature, depending on the temperature coefficients of Rh; and (b) as thermal trimming of Rh occurs, both its room-temperature resistance and its temperature coefficients may change as well. Therefore, it may be useful to experimentally determine the relevant range of resistances which Rh may assume during intended operation (trimming and potentially annealing and measurement of temperature coefficients, as mentioned above), as a basis for deciding the initial ratio Rb/Rh0. The optimal ratio Rb/Rh0 should be decided depending on a tradeoff between desired trim range of the heater-resistor, and desired precision within which power must be maintained by the V-to-P conversion.

Figure 5B:
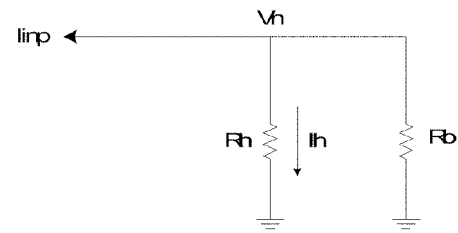
FIG. 5b is a circuit diagram of a generic passive current-to-power converter, using a ballast resistor in parallel with the heater-resistor.

Alternatively, if it is desired to provide the input trimming pulses as current-controlled, then it is also possible to use a simple passive I-to-P conversion circuit, for example that shown in FIG. 5b. Consider below the two cases of Rb=Rh, and Rb=infinite.

1. Rb=1 k=Rh
$Rh_0$=1 k; $I_{inp}$=2 mA, then
$Vh_0$=1V; $Ih_0$=1 mA; $Wh_0$=1 mW.
Rh→0.9 k
Ih=1.052 mA, Vh=0.947V; Wh=0.996 mW
dW=0.4%

2. Rb=∞
$Rh_0$=1 k; $I_{inp}$=1 mA, then
$Ih_0$=1 mA, $Vh_0$=1V; Wh=1 mW
Rh→0.9 k
Ih=1 mA; Vh=0.9V; Wh=0.9 mW
dW=10%

There are other ways to implement V-to-P or I-to-P conversion. The two already described above may be characterized as (1) "active analog multiplier", and (2) "passive" (also analog). In addition, there can be pulse-width-modulation. In pulse-width modulation (PWM), a sequence of pulses are applied, where the duration of the pulses and/or separation between pulses is modulated. The pulses may be of constant width with separations varying, or constant separation with pulse-widths varying, or constant period with duty-cycle (pulse-width) varying. One typically uses PWM when the frequency of the pulses is considerably faster than the ability of the circuit to respond, such that the circuit "accepts" only a time-averaged current or voltage or power. This time-averaged current, voltage or power accepted by the circuit is controlled by modulating the pulse-width, separation-width or duty-cycle.

Also, one could implement the I*V multiplication inherent in active V-to-P or I-to-P, conversion by using a "digital multiplier" which accepts the analog signals via ADC and returns the appropriate power-converted signal by DAC.

Typical thermal trimming is intended to be accomplished during a time period when the temperature in the functional resistor is stabilized. Thus, a global purpose of the technique is to stabilize the temperature during the trimming time period, which is typically intended to be longer than the transient thermal response time of the microstructure. However, the thermal response time of the microstructure may not be insignificant compared to the pulse duration (e.g. as shown in FIG. 1). In general, the response time of the V-to-P converter should be properly designed, given the thermal response-time of the heater. If the V-to-P converter is too slow, then one reaches trimming temperatures without being at the desired temperature, leading to unpredictable trims.

Furthermore, since trimming of the heater-resistor may happen during a single trimming pulse, the V-to-P converter must be able to adjust the voltage applied to the heater-resistor fast enough in order to maintain the desired constant power, even while the resistance is changing (being trimmed). For example, if significant resistance changes may happen in less than 1 ms, then the V-to-P converter should be able to react faster than this (e.g. 0.1 or 0.2 ms). As alluded to above, $T(t)=G*P(t)=G*V(t)*I(t)=G*V^2(t)/R(t)=G*I^2(t)*R(t)$. If R(t) is changing rapidly with time, in order for the temperature T(t) to be adequately controlled even while those changes are occurring, V(t) and I(t) must be made to react at least as quickly, by the V-to-P or I-to-P conversion.

In practice, one may by experimental measurements determine (a) the thermal response time of reversible temperature-induced resistance changes in the microstructure, and (b) the speed of (or time taken by) resistance changes in the heater-resistor at the temperatures (or power levels) of interest for (needed for) trimming of the functional resistor. Once these are known (found experimentally or otherwise), then one may design the loop time delay of an active V-to-P or I-to-P converter to be shorter (faster) than the faster of (a) and (b).

In the passive implementation (using only a fixed-value ballast resistor, as described above), the conversion-time will automatically (passively) track the heater-response-time.

This method is particularly useful when the trimming temperatures of the functional resistor are approximately equal to, or greater than, the trimming temperatures of the heater. If the trimming temperatures of the heater are significantly greater than the trimming temperatures of the functional resistor, then one may assume that the heater is stable during trimming, and one can calibrate the heater's TCR and control it via voltage pulses. In this case, it is still useful to have V-to-P or I-to-P conversion to avoid possible calibration errors.

Figure 6:
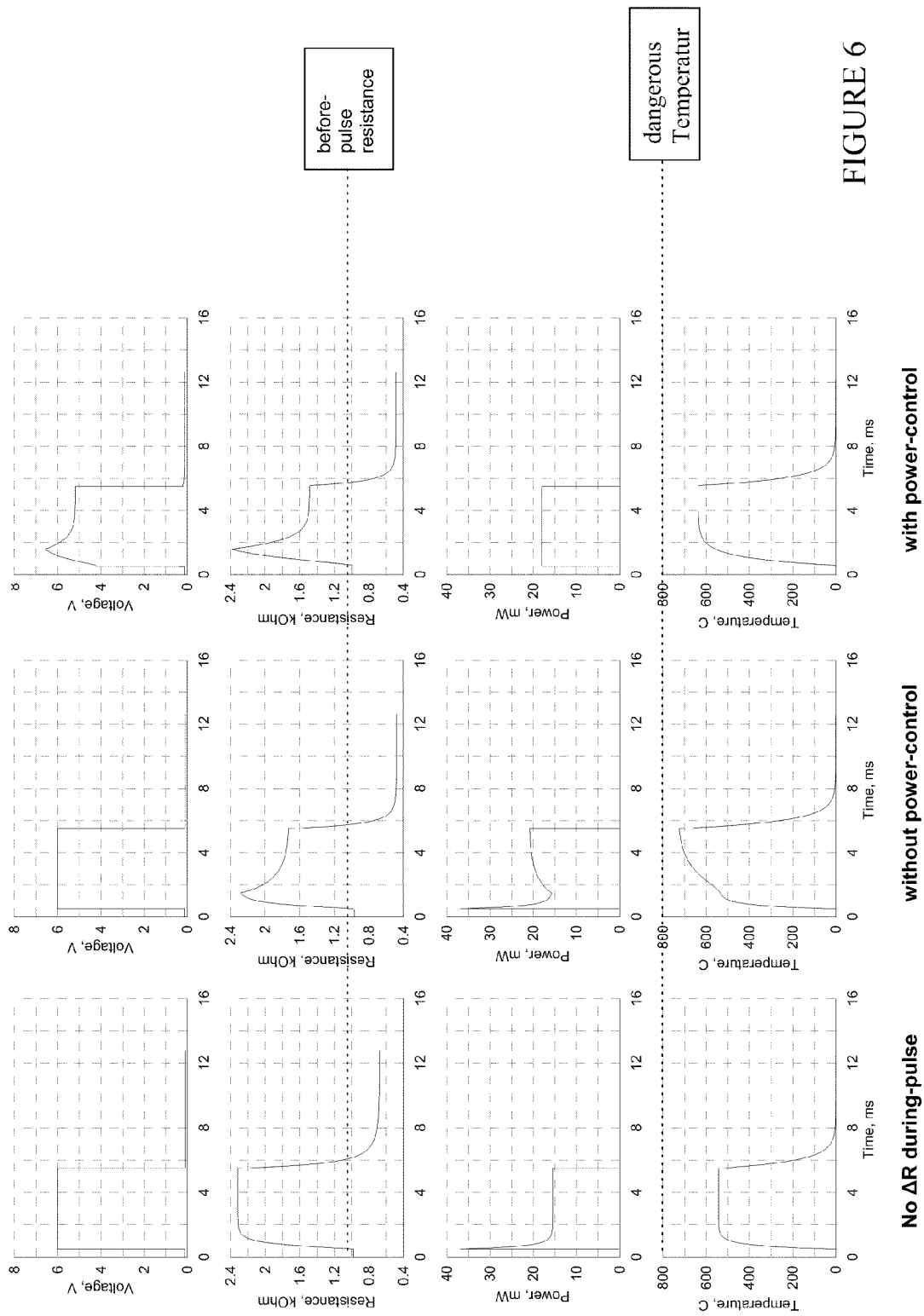
FIG. 6 shows three examples of voltage, resistance, power and temperature: (left-side) where there is no $\Delta R$ during a constant-voltage input pulse; (middle) where non-zero $\Delta R$ causes unwanted $\Delta P$, and therefore unwanted $\Delta T$; and (right-side) where the input pulse (voltage) is modulated in order to keep the power constant during the pulse, in order that the temperature remains constant even while the resistance is being thermally-trimmed during the pulse.

FIG. 6 develops three examples of relationships between voltage, resistance, power and temperature, during a thermal trimming pulse, in the case where the resistance has a significant positive TCR. On the left side of the figure, a constant-voltage pulse is input. The resistance (inferred from the measured current), rises from its before-pulse room-temperature resistance to its heated value, during the thermal-response time ($\tau_0$) of the microstructure. The power ($V^2/R$) also responds accordingly, reaching its steady-state value after a thermal-response transient. Similarly the temperature reaches the intended trimming temperature $T_{trim}$=G*P. Since there is no change in resistance $\Delta R$ during the pulse (other than the thermal response transient which manifests due to the natural positive TCR of the resistance material), after the initial transient the temperature maintains at constant level until the end of the pulse. At the end of the pulse, the temperature returns to room temperature, and, if thermal trimming occurs during this temperature-drop, then the after-pulse resistance is changed from the before-pulse resistance.

In the middle column of graphs in FIG. 6, the problem motivating this invention is shown. Here the resistance changes, even after the initial thermal response transient is finished. It is depicted as $\Delta R$ changing in the negative direction, which causes unwanted instantaneous $\Delta P$, and therefore unwanted $\Delta T$, during the single pulse. Note that the temperature has risen near to a "dangerous temperature" at which the heater-resistor is prone to catastrophic damage (open-circuit).

At the right side of FIG. 6, the solution proposed by this invention is depicted. Instead of maintaining the voltage constant during the pulse, the input voltage is modulated in order to keep the power constant during the pulse, in order to maintain the temperature constant at T=G*P (after the thermal-response transient, $\tau_1$), even while the resistance is being thermally-trimmed (large $\Delta R$) during the pulse.

The power-measured trimming technique, (where the electrical pulse is characterized in that the parameter by which it is measured is dissipated power), with the condition that the dissipated power is maintained substantially constant over the duration of a single pulse, even if there are changes in the resistance in which the power is dissipated, is also applicable to the case where there are several thermally-isolated microplatforms, each with a heater-resistor. The case where all of the heater-resistors have nominally-equal initial resistance is particularly interesting. These several heater-resistors may be connected in parallel or in series, and the present technique offers certain advantages, as compared with using voltage-measured electrical pulses.

For example consider the case where five heater-resistors, each having initial resistance 5R, are connected in parallel such that the overall resistance is R, and the electrical pulse is voltage-measured, with value $V_{pulse}$, and initial pulse power $V_{pulse}^2/R$. In this case, if the resistance of one of the heater-resistors changes with respect to the others, the electrical pulse voltage should remain constant and this "weak" heater-resistor may be subject to thermal runaway as described above. For example if the resistance of the "weak" heater-resistor changes from 5R to 4R, the current will increase from $V_{pulse}/5R$ to $V_{pulse}/4R$, thus increasing the power dissipated in that "weak" heater-resistor from $V_{pulse}^2/5R$ to $V_{pulse}^2/4R$ (a factor of 5/4), leading to a significant temperature increase and possibly thermal runaway.

For comparison, consider the case where the five parallel heater-resistors each have initial resistance 5R, but the electrical pulse is power-measured, with value $P_{pulse}=V_{i\text{-}pulse}^2/R$, where $V_{i\text{-}pulse}$ is the initial pulse voltage. If the resistance of one of the heater-resistors changes (decreases) with respect to the others, the electrical pulse power should remain constant. Since the overall resistance has decreased, in order to maintain constant power the current must increase and the voltage must decrease. For example, if the resistance of the "weak" heater-resistor changes from 5R to 4R, the overall resistance of the parallel combination decreases from R to (4R||5R/4)=20R/21, slightly less than R. In order to maintain the constant power $P_{pulse}$, the voltage must decrease slightly from $V_{i\text{-}pulse}$ to $V_{i\text{-}pulse}(20/21)^{0.5}$, and corresponding overall current increasing from $V_{i\text{-}pulse}/R$ to $V_{i\text{-}pulse}/R(20/21)^{0.5}$. Of course, the power dissipated in the "weak" heater-resistor will increase from $Vi_{\text{-}pulse}^2/5R$ to $Vi_{\text{-}pulse}^2(20/21)/4R=Vi_{\text{-}pulse}^2(5/21R)$, which is a factor of 25/21, less than 5/4, with correspondingly less tendency for thermal runaway.

On the other hand, if the heater-resistors are connected in series, similar analysis (based on Ohm's Law) shows that if a voltage-measured pulse is used, and if the resistance decreases, the power dissipated in the "weak" heater-resistor will decrease, naturally compensating for the resistance change and avoiding thermal runaway. If a power-measured pulse is used, and if the resistance decreases, the power dissipated in the "weak" heater-resistor will again decrease, but not by as much as if the pulse was voltage-measured. However, this natural decrease in power will still act to compensate for the resistance change, and avoid thermal runaway.

Similar Ohm's Law analyses can be done for the cases where the resistance instability is in the positive direction (where the resistance increases during trimming). The choice of voltage- or current- or power-measured pulses should be done keeping in mind the directions and magnitudes of the various types of resistance changes and instabilities (+/−TC, nonlinearity of temperature coefficients, non-tempco-based resistance changes at high temperatures, and the overall combination of these effects at high temperatures).

Figure 7:
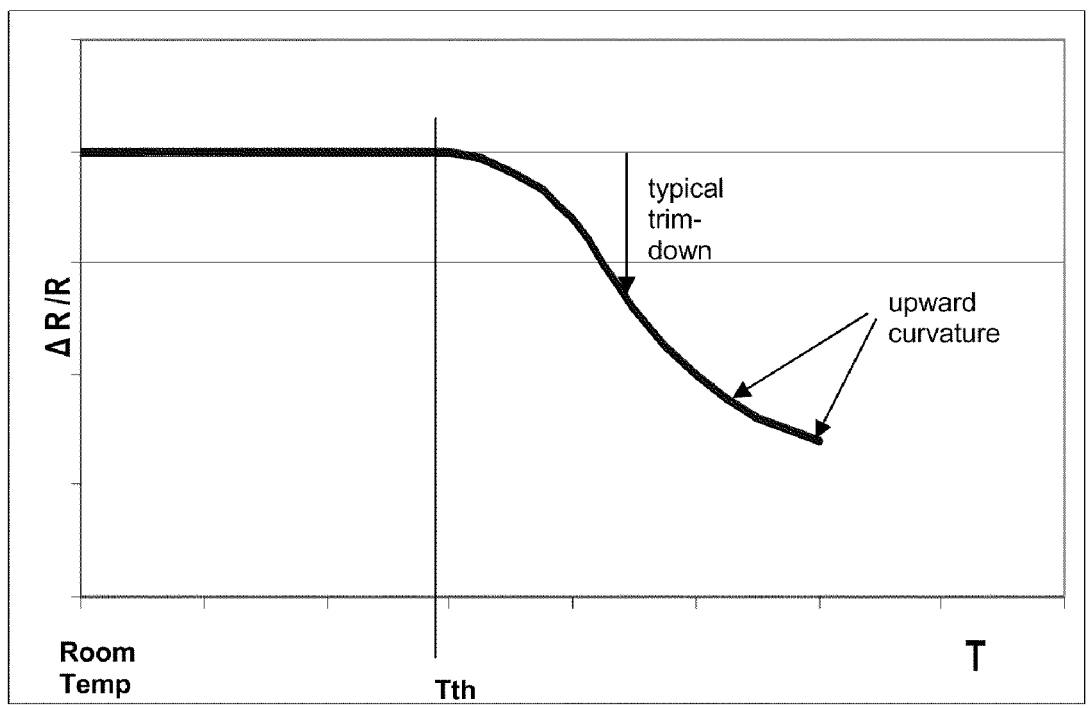
FIG. 7 shows a graph relating behaviour of change in resistance divided by initial resistance ($\Delta R/R$) vs. temperature (T), for typical thermally-trimmable materials whose resistance trims down at high temperatures. Note that this behavior does not take account of any non-zero temperature coefficients of the thermally-trimmable material.

Furthermore, consider FIG. 7. At temperatures near room temperature, no trimming occurs. As temperature increases, a thermal trimming threshold, $T_{th}$, is reached, above which trimming occurs. Whether or not the resistance increases or decreases at temperatures close to and above this threshold, it typically decreases at higher temperatures, as the resistance trims down. Thus the curve of $\Delta R/R$ (change in resistance divided by initial resistance) vs T is shown to be negative-sloping in the high-T portion of the T axis. As the trimming temperature increases, the amount of trim-down increases, represented by this curve becoming more negative at higher temperatures. However, it is empirically found that in some cases of thermally-trimmable materials, such as polycrystalline silicon, as the temperature increases further, the slope of $\Delta R/R$ becomes less negative.

In the context of thermal trimming of several heater-resistors connected in parallel using power-measured electrical pulses, and maintaining the power constant during the pulse even if the resistance changes, this type of characteristic curve acts in our favor. If one of the parallel heater-resistors does become "weak", if such an upward curvature occurs before catastrophic failure, this acts to allow the other resistors (other than the "weak" heater-resistor) to "catch up" (in other words, to be trimmed down faster such that the difference is reduced between the "weak" heater-resistor and the other resistors).

The embodiment(s) of the invention described above is(are) intended to be exemplary only. The scope of the invention is therefore intended to be limited solely by the scope of the appended claims.

We claim:

1. A method for trimming a thermally-trimmable resistor thermally-isolated on a substrate, the method comprising:
   applying a signal to a heating resistor to trim said thermally-trimmable resistor; and
   maintaining power dissipated in said heating resistor substantially constant over a duration of said signal by varying at least one parameter of said signal as a result of a change in resistance of said heating resistor during said signal.

2. A method as claimed in claim 1, wherein said signal is a single electrical pulse, and said power dissipated in said heating resistor is maintained substantially constant over a duration of said single pulse.

3. A method as claimed in claim 1, wherein said signal is a sequence of pulses, said maintaining power dissipated in said heating resistor substantially constant comprises maintaining a time-averaged power of said signal substantially constant over said sequence of pulses.

4. A method as claimed in claim 2, wherein said maintaining power dissipated in said heating resistor substantially constant comprises maintaining an instantaneous power of said single pulse substantially constant.

5. A method as claimed in claim 2, wherein said maintaining power dissipated in said heating resistor substantially constant comprises maintaining a time-averaged power of said single pulse substantially constant.

6. A method as claimed in claim 1, wherein said maintaining power dissipated in said heating resistor substantially constant comprises converting said signal from voltage to power by transforming input voltage into output power.

7. A method as claimed in claim 1, wherein said maintaining power dissipated in said heating resistor substantially constant comprises converting said signal from current to power by transforming input current into output power.

8. A method as claimed in claim 1, wherein said maintaining power dissipated in said heating resistor substantially constant comprises using a feedback loop to compensate for said change in resistance.

9. A method as claimed in claim 8, wherein said feedback loop is designed to have a loop delay time shorter than a thermal response time of reversible temperature-induced resistance changes in a microstructure and shorter than a speed of resistance change in said heating resistor at temperatures needed for said trimming.

10. A method as claimed in claim 1, wherein said maintaining power dissipated in said heating resistor substantially constant comprises providing a ballast resistor in series with said heating resistor to increase current and decrease voltage across said heating resistor as a result of a decrease in resistance of said heating resistor.

11. A method as claimed in claim 10, wherein said providing a ballast resistor comprises selecting a ratio for said ballast resistor versus said heating resistor as a function of a desired trim range of said heating resistor and a desired precision for said maintaining power dissipated in said heating resistor substantially constant.

12. A method as claimed in claim 10, wherein said providing a ballast resistor comprises selecting a value for said ballast resistor within a range of resistances which said heating resistor may assume during said trimming.

13. A method as claimed in claim 1, wherein said maintaining power dissipated in said heating resistor substantially constant comprises monitoring a current across said heating resistor and varying a voltage as a result of a change in said current.

14. A method as claimed in claim 1, wherein said maintaining power dissipated in said heating resistor substantially constant comprises monitoring a voltage across said heating resistor and adjusting a current as a result of a change in said voltage.

15. A method as claimed in claim 1, wherein said applying a signal to a heating resistor comprises applying said signal directly to said thermally-trimmable resistor, which acts as said heating resistor by self-heating.

16. A method as claimed in claim 1, wherein said applying a signal comprises choosing parameters of said signal as a function of a direction and magnitude of resistance instability.

17. A method as claimed in claim 1, wherein said varying at least one parameter of said signal comprises pulse-width modulation to change an average power dissipated during said signal.

18. A method as claimed in claim 1, wherein said change in resistance is a change in variation of resistance versus temperature due to material instability.

19. A method as claimed in claim 1, wherein said applying a signal to a heating resistor comprises applying a power-measured signal.

20. A circuit for trimming a thermally-trimmable resistor, measuring a temperature coefficient of resistance of said thermally-trimmable resistor, and annealing a thermally-trimmable resistor post-trimming, the circuit comprising:
    a thermally-isolated area on a substrate housing said thermally-trimmable resistor;
    heating circuitry for applying a signal to a heating resistor; and
    a constant-power module adapted to maintain power dissipated in said heating resistor substantially constant over a duration of said signal by varying at least one parameter of said signal as a result of a change in resistance of said heating resistor during said signal.

21. A circuit as claimed in claim 20, wherein said heating circuitry is adapted to apply at least one electrical pulse, and said constant-power module maintains power dissipated in said heating resistor substantially constant over a duration of a single pulse.

22. A circuit as claimed in claim 20, wherein said heating circuitry is adapted to apply a sequence of pulses, and said constant-power module maintains a time-averaged power of said signal said substantially constant over a duration of said sequence of pulses.

23. A circuit as claimed in claim 21, wherein said constant-power module is adapted to maintain an instantaneous power of said single pulse substantially constant.

24. A circuit as claimed in claim 21, wherein said constant-power module is adapted to maintain a time-averaged power of said single pulse substantially constant.

25. A circuit as claimed in claim 20, wherein said constant-power module converts said signal from voltage to power by transforming input voltage into output power.

26. A circuit as claimed in claim 20, wherein said constant-power module converts said signal from current to power by transforming input current into output power.

27. A circuit as claimed in claim 20, wherein said constant-power module comprises a feedback loop to compensate for said change in resistance.

28. A circuit as claimed in claim 27, wherein said feedback loop has a loop delay time shorter than a thermal response time of reversible temperature-induced resistance changes in a microstructure and shorter than a speed of resistance change in said heating resistor at temperatures needed for said trimming.

29. A circuit as claimed in claim 20, wherein said constant-power module comprises a ballast resistor in series with said heating resistor to increase current and decrease voltage across said heating resistor as a result of a decrease in resistance of said heating resistor.

30. A circuit as claimed in claim 29, wherein said ballast resistor has a resistance value within a range of resistances which said heating resistor may assume during said trimming.

31. A circuit as claimed in claim 20, wherein said constant-power module monitors a current across said heating resistor and varies a voltage as a result of a change in said current.

32. A circuit as claimed in claim 20, wherein said constant-power module monitors a voltage across said heating resistor and adjusts a current as a result of a change in said voltage.

33. A circuit as claimed in claim 20, wherein said constant-power module modulates a pulse-width of said signal to change an average power dissipated during said signal.

34. A circuit as claimed in claim 20, wherein said heating resistor acts as said thermally-trimmable resistor by self-heating.

* * * * *